(12) United States Patent
Chang et al.

(10) Patent No.: US 12,267,079 B2
(45) Date of Patent: Apr. 1, 2025

(54) CLOCK AND DATA RECOVERY DEVICE

(71) Applicants: SILICON MITUS, INC., Seongnam-Si (KR); Hangzhou Silicon-Magic Semiconductor Technology Co., Ltd., Hangzhou (CN)

(72) Inventors: Young Jae Chang, Seoul (KR); Sung Ryong Lee, Seongnam-Si (KR); Jae Sam Shim, Seoul (KR)

(73) Assignees: SILICON MITUS, INC., Seongnam-Si (KR); Hangzhou Silicon-Magic Semiconductor Technology Co., Ltd., Hangzhou (CN)

( * ) Notice: Subject to any disclaimer, the term of this patent is extended or adjusted under 35 U.S.C. 154(b) by 21 days.

(21) Appl. No.: 18/345,872

(22) Filed: Jun. 30, 2023

(65) Prior Publication Data

US 2024/0072811 A1   Feb. 29, 2024

(51) Int. Cl.
*H03L 7/081* (2006.01)
*H03L 7/089* (2006.01)
*H04L 7/033* (2006.01)

(52) U.S. Cl.
CPC ............ *H03L 7/0816* (2013.01); *H03L 7/089* (2013.01); *H04L 7/033* (2013.01)

(58) Field of Classification Search
CPC ....... H03L 7/08; H03L 7/0807; H03L 7/0816; H03L 7/085; H03L 7/089; H03L 7/0891; H03L 7/097; H03L 7/102; H03L 7/104; H03L 7/1077; H03L 7/145; H04L 7/033

USPC ......... 375/326, 327, 374–376; 327/146–148, 327/155–157

See application file for complete search history.

(56) References Cited

U.S. PATENT DOCUMENTS

| | | | |
|---|---|---|---|
| 2014/0266338 A1* | 9/2014 | Malipatil | H03L 7/091 327/155 |
| 2016/0181913 A1* | 6/2016 | Feng | H02M 3/07 327/536 |
| 2021/0281389 A1* | 9/2021 | Lou | H03L 7/091 |
| 2022/0407422 A1* | 12/2022 | Qin | H02M 1/14 |

FOREIGN PATENT DOCUMENTS

| | | |
|---|---|---|
| KR | 100780959 B1 | 12/2007 |
| KR | 20120025179 A | 3/2012 |
| KR | 101706196 B1 | 2/2017 |

* cited by examiner

*Primary Examiner* — Young T. Tse
(74) *Attorney, Agent, or Firm* — Osha Bergman Watanabe & Burton LLP (57) ABSTRACT

A clock and data recovery device includes an equalizer that compensates for channel loss of input data, a phase detector that compares a data output from the equalizer with a clock fed back and outputs an up signal and a down signal, a charge pump that operates according to the up signal and the down signal and outputs a control signal, a loop filter that removes high-frequency components included in the control signal, a voltage controlled oscillator that changes a frequency of the clock and outputs a clock with changed frequency, and a data phase adjuster that synchronizes the clock output from the voltage controlled oscillator and the data output from the equalizer by adjusting a phase of the data output from the equalizer by receiving the up signal and the down signal output from the phase detector.

11 Claims, 8 Drawing Sheets

CLOCK AND DATA RECOVERY DEVICE

CROSS-REFERENCE TO RELATED APPLICATION

This application claims priority to Korean Patent Application No. 10-2022-0107376 filed on Aug. 26, 2022 and all the benefits accruing therefrom under 35 U.S.C. § 119, the contents of which are incorporated by reference in their entirety.

BACKGROUND

One or more embodiments of the present disclosure relate to a clock and data recovery device. More specifically, one or more embodiments of the present disclosure relate to a clock and data recovery device capable of improving clock and data recovery characteristics by reducing loop delay in a bang-bang loop.

In general, in order to maintain a steady-stage, that is, a locking state operation, a clock and data recovery loop using a bang-bang style phase detector compares timings of data and a clock and performs an operation of changing the frequency of the clock to be faster or slower.

Figure 1:
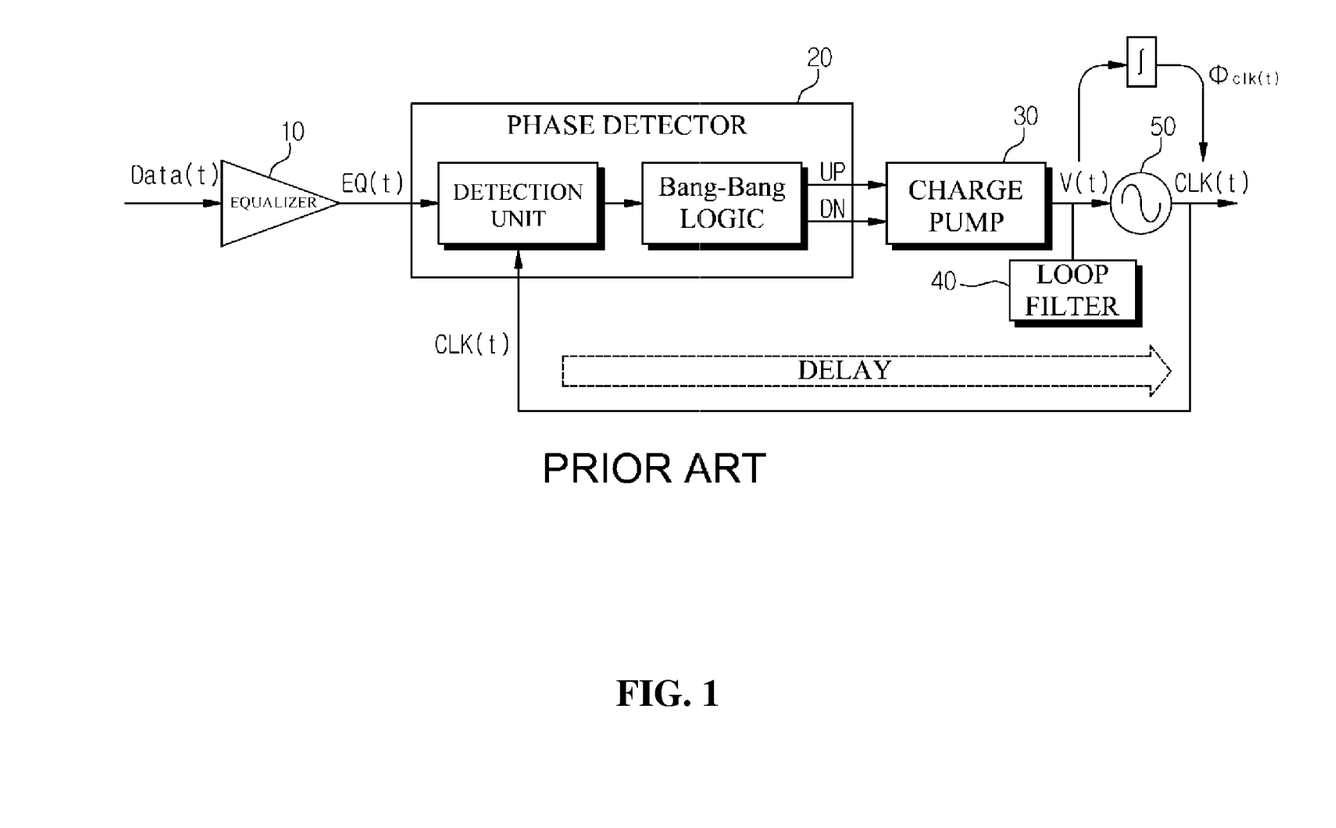
FIG. 1 is a diagram illustrating a clock and data recovery device according to prior art.
Figure 2:
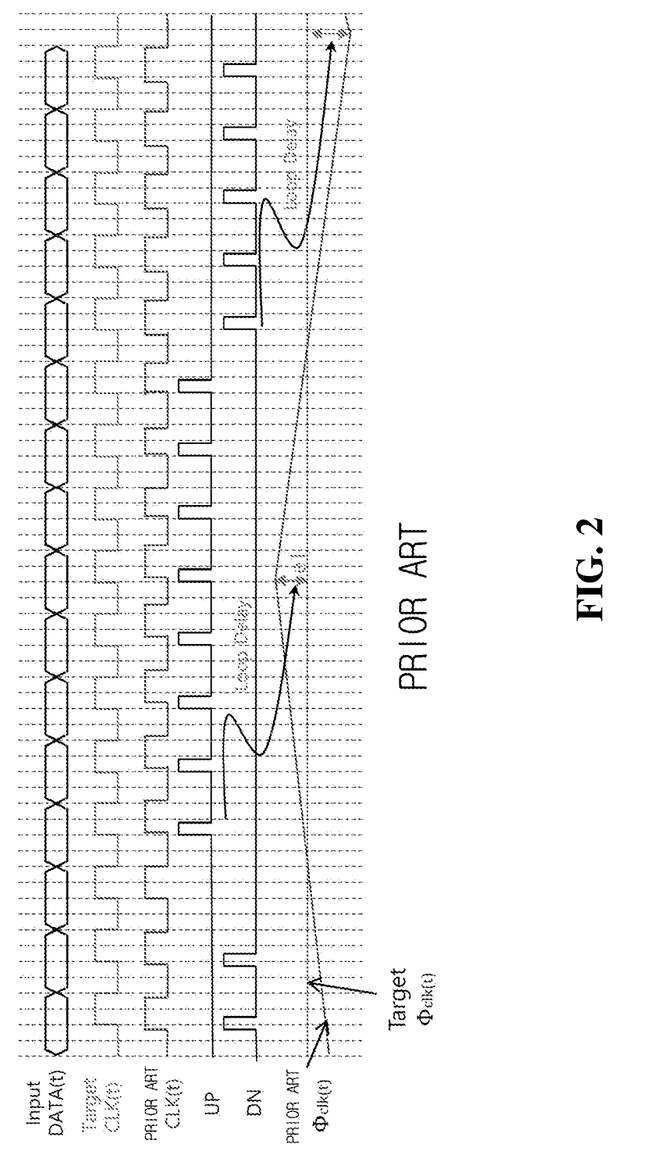
FIG. 2 is a diagram illustrating signal processing timing for synchronizing a clock and data in a clock and data recovery device according to prior art.

FIG. 1 is a diagram illustrating a clock and data recovery device according to the prior art and FIG. 2 is a diagram illustrating signal processing timing for synchronizing a clock and data in the clock and data recovery device according to the prior art.

Referring to FIGS. 1 and 2, the clock and data recovery device according to the prior art is configured with an equalizer 10 that compensates for channel loss of input data, a phase detector 20 that compares data output from the equalizer 10 with a clock fed back from a voltage controlled oscillator 50 and outputs an up signal UP and a down signal DN, a charge pump 30 that operates according to the up signal and the down signal and outputs a control signal for controlling the voltage controlled oscillator 50, a loop filter 40 that removes high-frequency components included in the control signal output from the charge pump 30, and the voltage controlled oscillator 50 that changes a frequency and outputs a clock with changed frequency according to the control signal from which the high-frequency components have been removed.

However, according to this prior art, since a delay occurs for a considerable time in comparing the timings of data and the clock and applying a frequency change of the voltage controlled oscillator according thereto, this becomes a factor in increasing the jitter in the bang-bang loop.

PRIOR ART LITERATURE

Patent Literature

PTL 1: Korean Patent Registration No. 10-0780959 (Registration date: Nov. 23, 2007, Title: Delay-locked loop circuit capable of reducing bang-bang jitter)

PTL 2: Korean Patent Registration No. 10-1706196 (Registration date: Feb. 7, 2017, Title: Bang-bang phase detector with improved phase synchronization performance) (ref.=High-Performance Phase Locking of . . . )

PTL 3: Korean patent unexamined patent application publication No. 10-2012-0025179 (published date: Mar. 15, 2012, Title: Clock and data recovery circuit with improved jitter characteristics using bang-bang phase detector)

SUMMARY

One or more embodiments of the present disclosure provide a clock and data recovery device capable of improving clock and data recovery characteristics by reducing loop delay in a bang-bang loop.

In addition, one or more embodiments of the present disclosure provide a clock and data recovery device that reduces the bang-bang loop jitter by immediately reflecting the up signal and down signal of the bang-bang loop to the input timing without delay to improve the timing margin of an internal clock and data generated inside the clock and data recovery circuit and improve the data and clock recovery characteristics even in external input noise, and enhance tracking performance of the clock and data recovery loop by immediately reflecting a timing error of the clock to the data in the clock and data recovery circuit when it occurs.

In accordance with one or more embodiments of the present application, a clock and data recovery device for reducing loop delay in a bang-bang loop includes an equalizer that compensates for channel loss of input data, a phase detector that compares data output from the equalizer with a clock fed back from a voltage controlled oscillator and outputs an up signal UP and a down signal DN, a charge pump that operates according to the up signal and the down signal and outputs a control signal, a loop filter that removes high-frequency components included in the control signal output from the charge pump, the voltage controlled oscillator that changes a frequency of the clock and outputs a clock with changed frequency according to the control signal from which the high-frequency components have been removed, and a data phase adjuster that synchronizes the clock output from the voltage controlled oscillator and the data output from the equalizer by adjusting a phase of the data output from the equalizer by receiving the up signal and the down signal output from the phase detector.

In the clock and data recovery device for reducing loop delay in the bang-bang loop, the phase detector may be a bang-bang phase detector.

In the clock and data recovery device for reducing loop delay in the bang-bang loop, the phase detector may output the up signal when a phase of the clock fed back from the voltage controlled oscillator is ahead of a phase of the data output from the equalizer, and output the down signal when the phase of the clock fed back from the voltage controlled oscillator is behind the phase of the data output by the equalizer.

In the clock and data recovery device for reducing loop delay in the bang-bang loop, the data phase adjuster may include a first capacitor installed between a ground and a transmission line connecting the equalizer and the phase detector, a first switch installed between the first capacitor and the transmission line, a second capacitor that is installed between the transmission line and the ground and is connected in parallel with the first capacitor, and a second switch installed between the second capacitor and the transmission line.

In the clock and data recovery device for reducing loop delay in the bang-bang loop, when both the up signal and the down signal output from the phase detector are at low levels, the first switch may maintain a closed state and the second switch may maintain an open state.

In the clock and data recovery device for reducing loop delay in the bang-bang loop, the data output from the equalizer may be delayed by a resistor-capacitor (RC) time corresponding to capacitance of the first capacitor and transmitted to the phase detector, so that the phase of the data output from the equalizer and the phase of the clock output from the voltage controlled oscillator may be synchronized with each other.

In the clock and data recovery device for reducing loop delay in the bang-bang loop, when the up signal output from the phase detector is at a high level, the first switch may maintain the closed state, and the second switch may be switched from the open state to the closed state.

In the clock and data recovery device for reducing loop delay in the bang-bang loop, the data output from the equalizer may be delayed by an RC time corresponding to capacitances of the first capacitor and second capacitor connected in parallel and transmitted to the phase detector.

In the clock and data recovery device for reducing loop delay in the bang-bang loop, since the first capacitor and the second capacitor are connected in parallel to increase the capacitance, an RC delay of the data output from the equalizer is increased compared to a case where both the up signal and the down signal output from the phase detector are at low levels, so that the phase of the data output from the equalizer and the phase of the clock output from the voltage controlled oscillator may be synchronized with each other.

In the clock and data recovery device for reducing loop delay in the bang-bang loop, when the down signal output from the phase detector is at a high level, the first switch may be switched from the closed state to the open state, and the second switch may maintain the open state.

In the clock and data recovery device for reducing loop delay in the bang-bang loop, since the first capacitor is separated from the transmission line, an RC delay of the data output by the equalizer is reduced compared to a case where both the up signal and the down signal output from the phase detector are at low levels, so that the phase of the data output from the equalizer and the phase of the clock output from the voltage controlled oscillator are synchronized with each other.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Specific structural or functional descriptions of embodiments according to the concept of the present application disclosed in this specification are only illustrated for the purpose of explaining the embodiments according to the concept of the present application, and the embodiments according to the concept of the present application may be embodied in various forms and should not be construed as limited to the embodiments set forth herein. Rather, these embodiments are provided so that this disclosure will be thorough and complete, and will fully convey the scope of the present application to those skilled in the art.

Various modifications may be made to the embodiments according to the concept of the present application and the embodiments may have various forms, and thus the embodiments are illustrated in the drawings and described in detail in this specification. However, this is not intended to limit the embodiments according to the concept of the present application to specific disclosure forms, and includes all modifications, equivalents, or substitutes included in the spirit and technical scope of the present application.

Unless otherwise defined, all terms used herein, including technical or scientific terms, have the same meaning as commonly understood by one of ordinary skill in the art to which the present application belongs. Terms such as those defined in commonly used dictionaries should be interpreted as having a meaning consistent with the meaning in the context of the prior art, and should not be interpreted in an ideal or excessively formal meaning unless explicitly defined in this specification.

Hereinafter, one or more embodiments of the present application will be described in detail with reference to the accompanying drawings.

Figure 3:
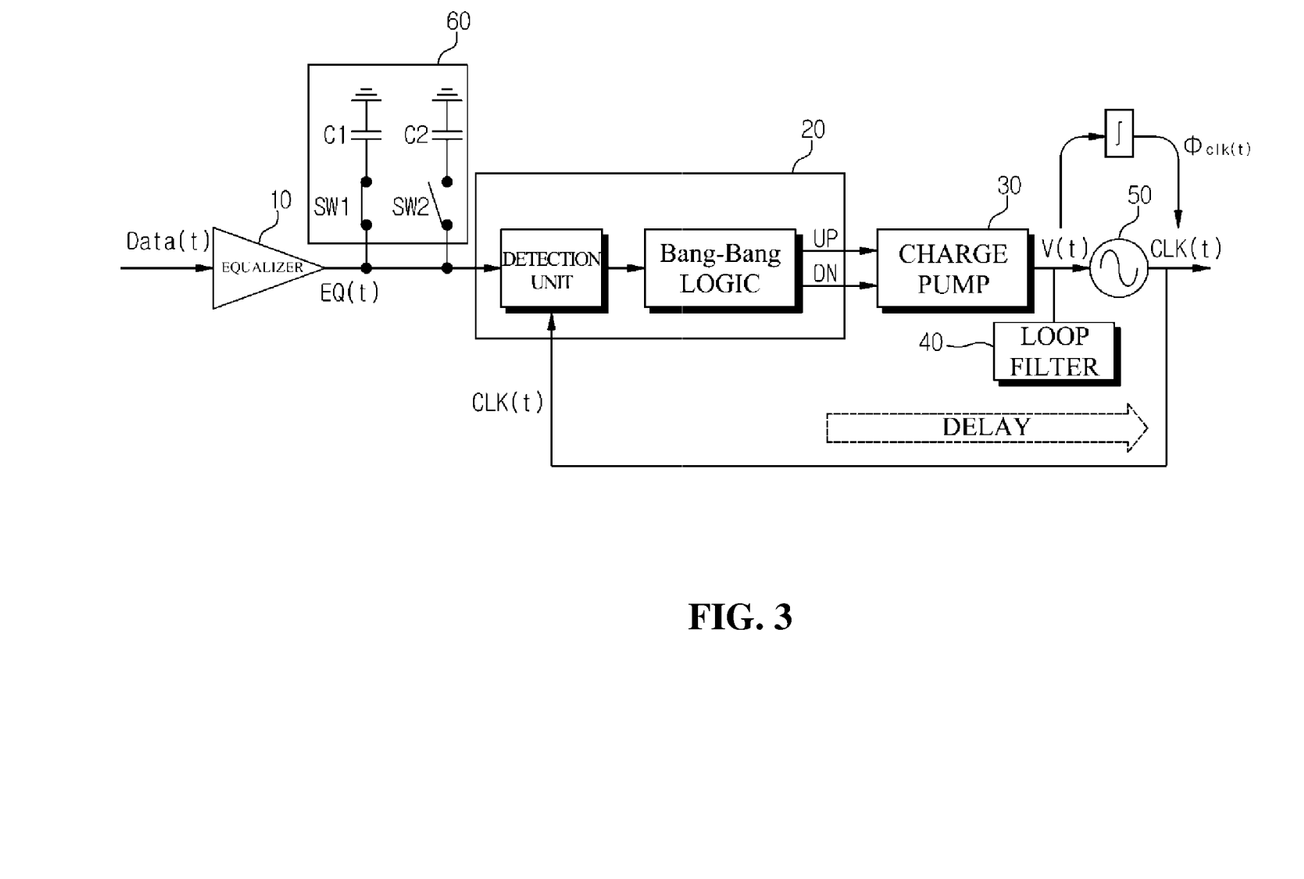
FIG. 3 is a diagram illustrating a clock and data recovery device in accordance with one or more embodiments of the present application.
Figure 4:
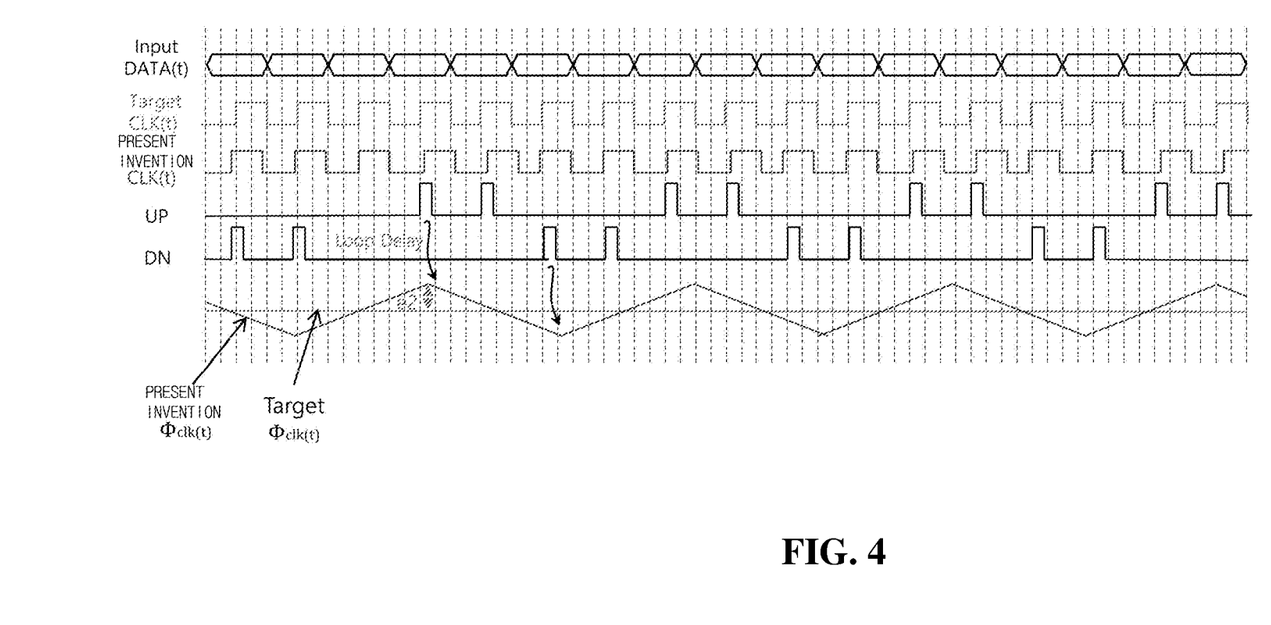
FIG. 4 is a diagram illustrating signal processing timing for synchronizing a clock and data in a clock and data recovery device in accordance with one or more embodiments of the present application.

FIG. 3 is a diagram illustrating a clock and data recovery device in accordance with one or more embodiments of the present application, and FIG. 4 is a diagram illustrating signal processing timing for synchronizing a clock and data in the clock and data recovery device in accordance with one or more embodiments of the present application.

Referring to FIGS. 3 and 4, the clock and data recovery device according to one or more embodiments of the present application includes an equalizer 10, a phase detector 20, a charge pump 30, a loop filter 40, a voltage controlled oscillator 50, and a data phase adjuster 60.

The equalizer 10 is a component that compensates for channel loss of data input from the outside. Specifically, the equalizer 10 may perform a function of receiving a high-speed transmission signal and compensating channel loss with a gain corresponding to a frequency of data, so that an internal IC can process it.

The phase detector 20 is a component that compares data output from the equalizer 10 with a clock fed back from the voltage controlled oscillator 50 to be described later, and outputs an up signal UP and a down signal DN in the form of pulses reflecting a phase difference between the two signals, and may be, for example, a bang-bang phase detector 20.

For example, the phase detector 20 may be configured to output the up signal UP when a phase of the clock fed back from the voltage controlled oscillator 50 is ahead of a phase of the data output from the equalizer 10, and output the down signal DN when the phase of the clock fed back from the voltage controlled oscillator 50 is behind that of the data output from the equalizer 10.

The charge pump 30 is a component that operates according to the up signal UP and the down signal DN input in the form of pulses and outputs a control signal for controlling the voltage controlled oscillator 50.

The loop filter 40 is a component that removes high-frequency components included in the control signal output from the charge pump 30 and may be a low pass filter (LPF).

The voltage controlled oscillator 50 is a component that changes a frequency of the clock and outputs a clock with changed frequency according to the control signal from which the high-frequency components have been removed.

The data phase adjuster 60 is a component that synchronizes the clock output from the voltage controlled oscillator 50 and the data output from the equalizer 10 by adjusting the phase of the data output from the equalizer 10 by receiving the up signal UP and the down signal DN output from the phase detector 20.

For example, the data phase adjuster 60 may be configured to include a first capacitor C1, a first switch SW1, a second capacitor C2, and a second switch SW2.

The first capacitor C1 is installed between a ground and a transmission line connecting the equalizer 10 and the phase detector 20.

The first switch SW1 is installed between the first capacitor C1 and the transmission line, and performs a function of connecting or disconnecting the first capacitor C1 to or from the transmission line by being opened or by directly receiving the output signal output from the phase detector 20.

The second capacitor C2 is installed between the transmission line and the ground and is connected in parallel with the first capacitor C1.

The second switch SW2 is installed between the second capacitor C2 and the transmission line, and performs a function of connecting or disconnecting the second capacitor C2 to or from the transmission line by being opened or by directly receiving the output signal output from the phase detector 20.

Hereinafter, a process of synchronizing the phase of the data output from the equalizer 10 and the phase of the clock output from the voltage controlled oscillator 50 will be described in detail and exemplarily with further reference to FIGS. 5A to 7B.

Figure 5A:
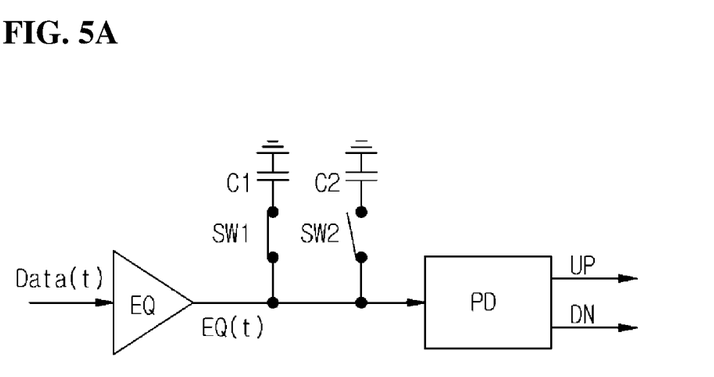
FIGS. 5A and 5B are diagrams for describing operations of a phase detector and a data phase adjuster performed when phases of a clock and data coincide and are synchronized with each other in one or more embodiments of the present application.
Figure 5B:
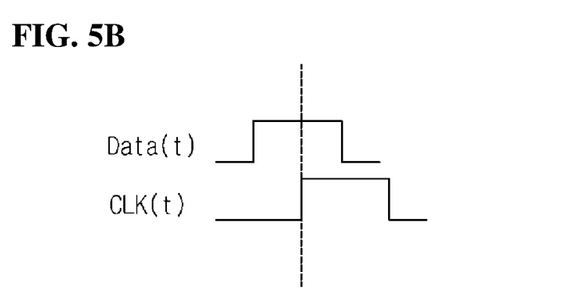

FIGS. 5A and 5B are diagrams for describing operations of the phase detector 20 and the data phase adjuster 60 performed when the phases of the clock and data output coincide and are synchronized with each other in one or more embodiments of the present application.

Referring further to FIGS. 5A and 5B, when both the up signal UP and the down signal DN directly output from the phase detector 20 by the data phase adjuster 60 are at low levels, the first switch SW1 maintains a closed state, and the second switch SW2 maintains an open state.

The fact that both the up signal UP and the down signal DN are directly output from the phase detector 20 are at low levels means that the data output from the equalizer 10 and the clock output from the voltage controlled oscillator 50 are synchronized.

In this case, that is, when the first switch SW1 is closed and the second switch SW2 is open, since the first capacitor C1 is electrically connected to the transmission line between the equalizer 10 and the phase detector 20 through the first switch SW1, the data output from the equalizer 10 is delayed by an RC time corresponding to capacitance of the first capacitor C1 and is transmitted to the phase detector 20, so that the phase of the data output from the equalizer 10 and the phase of the clock output from the voltage controlled oscillator 50 are synchronized with each other. That is, a state in which the data output from the equalizer 10 is delayed by the RC time corresponding to the capacitance of the first capacitor C1 can be referred to as a case in which the phases of the data and clock are synchronized with each other, and can be referred to as an initial default state.

Figure 6A:
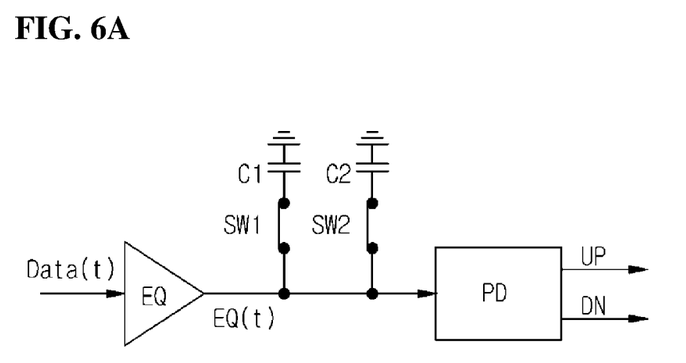
FIGS. 6A and 6B are diagrams for describing operations of a phase detector and a data phase adjuster performed to synchronize a clock and a data when a phase of the clock is ahead of a phase of the data in one or more embodiments of the present application.
Figure 6B:
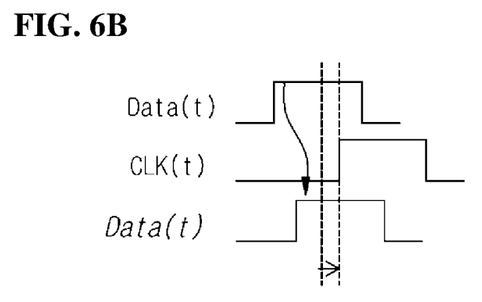

FIGS. 6A and 6B are diagrams for describing operations of the phase detector 20 and the data phase adjuster 60 performed to synchronize the clock and the data when the phase of the clock is ahead of the phase of the data in one or more embodiments of the present application.

Referring further to FIGS. 6A and 6B, when the up signal UP output from the phase detector 20 by the data phase adjuster 60 is at a high level, the first switch SW1 maintains the closed state, and the second switch SW2 is converted from the open state to the closed state.

The fact that the up signal UP directly output from the phase detector 20 is at a high level means that the phase of the clock output from the voltage controlled oscillator 50 is ahead of the phase of the data output from the equalizer 10, that is, the clock is leading.

In this case, that is, when the first switch SW1 and the second switch SW2 are closed, the first capacitor C1 is electrically connected to the transmission line between the equalizer 10 and the phase detector 20 through the first switch SW1, the second capacitor C2 is also electrically connected to the transmission line between the equalizer 10 and the phase detector 20 through the second switch SW2, and the first capacitor C1 and the second capacitor are electrically connected in parallel.

Accordingly, the data output from the equalizer 10 is delayed by the RC time corresponding to the capacitances of the first capacitor C1 and the second capacitor C2 connected in parallel and transferred to the phase detector 20, so that the phase of the data output from the equalizer 10 and the phase of the clock output from the voltage controlled oscillator 50 are synchronized with each other.

For example, a configuration may be made such that since the first capacitor C1 and the second capacitor C2 are connected in parallel to increase the capacitance, an RC delay of the data output from the equalizer 10 is increased compared to the case where both the up signal UP and the down signal DN output from the phase detector 20 are at low levels, and accordingly, the phase of the data output from the equalizer and the phase of the clock output from the voltage controlled oscillator are synchronized with each other.

In the processing operation illustrated in FIGS. 6A and 6B, since the phase of the clock is ahead of the phase of the data, when the phase of the clock needs to be delayed for phase synchronization, the same effect as delaying the phase of the clock can be obtained by changing the phase of the data by adjusting the delay of that of the data while the phase of the clock is fixed.

Figure 7A:
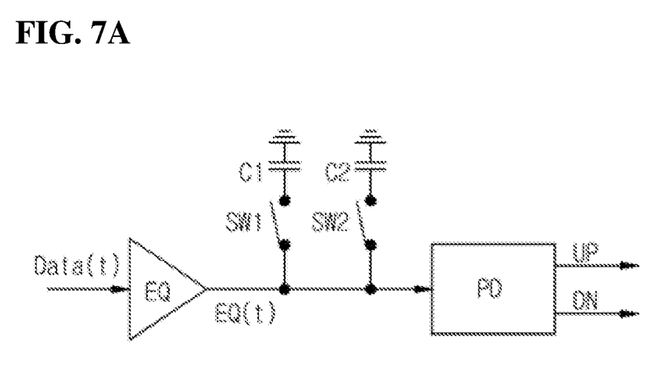
FIGS. 7A and 7B are diagrams for describing operations of a phase detector and a data phase adjuster performed to synchronize a clock and a data when a phase of the clock is behind a phase of the data in one or more embodiments of the present application.
Figure 7B:
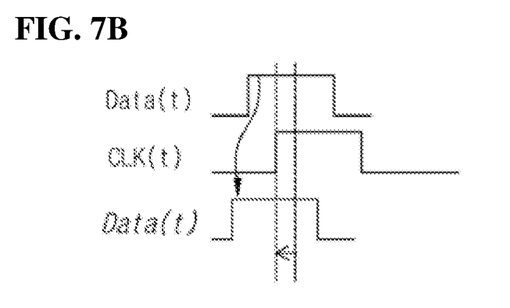

FIGS. 7A and 7B diagrams for describing operations of the phase detector 20 and the data phase adjuster 60 performed to synchronize the clock and the data when the phase of the clock is behind that of the data in one or more embodiments of the present application.

Referring further to FIGS. 7A and 7B, when the down signal DN output by the data phase controller 60 from the phase detector 20 is at a high level, the first switch SW1 is converted from the closed state to the open state, and the second switch SW2 maintains the open state.

The fact that the down signal DN directly output from the phase detector 20 is at a high level means that the phase of the clock output from the voltage controlled oscillator 50 is behind the phase of the data output from the equalizer 10, that is, the clock is lagging.

In this case, that is, when the first switch SW1 and the second switch SW2 are open, since the first capacitor is separated from the transmission line, the RC delay of the data output by the equalizer is reduced compared to the case where both the up signal and the down signal output from the phase detector 20 are at low levels, so that the phase of the data output from the equalizer 10 and the phase of the clock output from the voltage controlled oscillator 50 are synchronized with each other.

In the processing operation illustrated in FIGS. 7A and 7B, since the phase of the clock is behind the phase of the data, when the phase of the clock needs to be adjusted to advance for phase synchronization, the same effect as making the phase of the clock advance can be obtained by changing the phase of the data by adjusting the delay of the phase of the data while the phase of the clock is fixed.

Hereinafter, one or more embodiments of the present application described in detail above will be described according to a more specific example.

As described above, the clock and data recovery device according to one or more embodiments of the present application is required at the front stage of the IC in order to align the input data and the clock with accurate timing.

The phase detector 20 using the bang-bang loop compares output data EQ(t) of the equalizer 10, which receives the high-speed transmission signal and processes it so that the internal IC can process it, and a clock CLK(t) of the voltage controlled oscillator 50 to generate the up signal UP and the down signal DN. When a phase 1 of the clock generated by the voltage controlled oscillator 50 is late compared to a phase of the data, the phase detector 20 generates the up signal UP to increase the frequency of the clock output by the voltage controlled oscillator 50, and the phase $\Phi$, which is the integral of the frequency, is pulled forward. In contrast, when the clock is ahead of the data, the phase detector 20 generates the down signal DN, the frequency of the clock output by the voltage controlled oscillator 50 is decreased, and the phase, which is the integral value of the frequency, is pushed backward. The phase detector 20 generates the up signal UP and the down signal DN while comparing input data and the clock in real time, and maintains a position of the clock at which the data can be normally processed.

However, according to the prior art, the up signal UP and the down signal DN are generated by a timing error between the output data EQ(t) of the equalizer 10 and the clock, and through this, the frequency of the clock output by the voltage controlled oscillator 50 is changed, but delay of many circuit blocks occurs, which is illustrated in FIG. 2. This is called the loop delay, and as the loop delay increases, a phase error e1 increases, causing deviation of the clock from the normal timing at which data may be extracted.

If the up signal UP and the down signal DN are directly reflected in a phase $\Phi_{clk(t)}$, which is the phase of the clock, not only a phase error with respect to the target $\Phi_{clk(t)}$ in FIG. 2 is reduced, but also the response speed of the loop also increases.

As illustrated in FIG. 3, in one or more embodiments of the present application, a capacitor is directly connected to the output side of the equalizer 10 according to the up signal UP and the down signal DN without causing the change in the loop to go through the charge pump 30, the loop filter 40, and the voltage controlled oscillator 50. If a case in which the clock is pulled forward than the data occurs, the up signal is generated and the capacitor is grounded and connected to an output end of the equalizer 10 during this period, so that the data is pushed backward. This has the same effect as pulling the phase forward. Briefly, in other words, when the phase needs to be pulled forward, the output signal of the equalizer 10 is immediately pushed backward, so that the effect of actually pulling the phase occurs, which minimizes the loop delay.

FIG. 4 illustrates a principle in which a smaller difference occurs in the timing at which the phase should normally be positioned compared to a circuit implemented in the prior art when the present application is applied. Compared to the phase error e1 according to the prior art of FIG. 2, not only the phase error e2 according to one or more embodiments of the present application is reduced, but also the triangular period of bang-bang is shortened. This means that the characteristics of the clock and data recovery circuit are improved.

Figure 8:
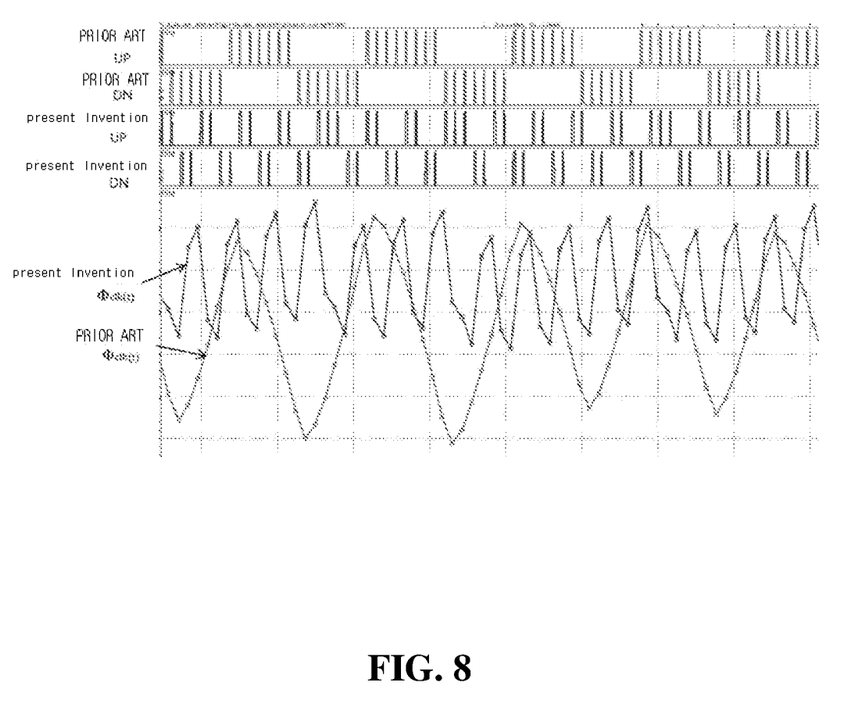
FIG. 8 is a diagram illustrating phase characteristics of clocks in comparison with each other in prior art and in one or more embodiments of the present application.

FIG. 8 is a diagram illustrating phase characteristics of clocks in comparison with each other in the prior art and in one or more embodiments of the present application. FIG. 8 illustrates simulation results in which $\Phi_{clk(t)}$ is improved by applying it to an actual circuit. As can be seen from the simulation results, when the present application is applied, it can be checked that the phase error actually implemented at the normal position at the intermediate timing of the data is significantly reduced.

As described in detail above, one or more embodiments of the present application provide a clock and data recovery device capable of improving clock and data recovery characteristics by reducing loop delay in a bang-bang loop.

In addition, one or more embodiments of the present application are capable of reducing the bang-bang loop jitter by immediately reflecting the up signal and down signal of the bang-bang loop to the input timing without delay, the timing margin of an internal clock and data generated inside a clock and data recovery circuit is improved, the data and clock recovery characteristics is improved even in external input noise, and tracking performance of the clock and data recovery loop is enhanced by immediately reflecting a timing error of the clock to the data in the clock and data recovery circuit when it occurs.

As described in detail above, one or more embodiments of the present application provide a clock and data recovery device capable of improving clock and data recovery characteristics by reducing loop delay in a bang-bang loop. In addition, one or more embodiments of the present application are capable of reducing the bang-bang loop jitter by immediately reflecting the up signal and down signal of the bang-bang loop to the input timing without delay, the timing margin of an internal clock and data generated inside a clock and data recovery circuit is improved, the data and clock recovery characteristics is improved even in external input noise, and tracking performance of the clock and data recovery loop is enhanced by immediately reflecting a timing error of the clock to the data in the clock and data recovery circuit when it occurs.

Although the clock and data recovery device has been described with reference to the specific embodiments, it is not limited thereto. Therefore, it will be readily understood by those skilled in the art that various modifications and changes can be made thereto without departing from the spirit and scope of the present application defined by the appended claims.

What is claimed is:

1. A clock and data recovery device for reducing loop delay in a bang-bang loop comprising:
    an equalizer that compensates for channel loss of input data;
    a phase detector that compares a data output from the equalizer with a clock fed back from a voltage controlled oscillator and outputs an up signal and a down signal;
    a charge pump that operates according to the up signal and the down signal and outputs a control signal;
    a loop filter that removes high-frequency components included in the control signal output from the charge pump;
    the voltage controlled oscillator that changes a frequency of the clock and outputs a clock with changed frequency according to the control signal from which the high-frequency components have been removed; and
    a data phase adjuster that synchronizes the clock output from the voltage controlled oscillator and the data output from the equalizer by adjusting a phase of the data output from the equalizer by receiving the up signal and the down signal output from the phase detector.

2. The clock and data recovery device of claim 1, wherein the phase detector is a bang-bang phase detector.

3. The clock and data recovery device of claim 1, wherein the phase detector
    outputs the up signal when a phase of the clock fed back from the voltage controlled oscillator is ahead of a phase of the data output from the equalizer, and
    outputs the down signal when the phase of the clock fed back from the voltage controlled oscillator is behind the phase of the data output by the equalizer.

4. The clock and data recovery device of claim 3, wherein the data phase adjuster comprises
    a first capacitor installed between a transmission line connecting the equalizer and the phase detector and a ground,
    a first switch installed between the first capacitor and the transmission line,
    a second capacitor installed between the transmission line and the ground and connected in parallel with the first capacitor, and
    a second switch installed between the second capacitor and the transmission line.

5. The clock and data recovery device of claim 4, wherein when both the up signal and the down signal output from the phase detector are at low levels, the first switch is at a closed state and the second switch maintains an open state.

6. The clock and data recovery device of claim 5, wherein the data output from the equalizer is delayed by a resistor-capacitor (RC) time corresponding to a capacitance of the first capacitor and transmitted to the phase detector, so that the phase of the data output from the equalizer and the phase of the clock output from the voltage controlled oscillator are synchronized with each other.

7. The clock and data recovery device of claim 5, wherein when the up signal output from the phase detector is at a high level, the first switch is at the closed state, and the second switch is switched from the open state to the closed state.

8. The clock and data recovery device of claim 7, wherein the data output from the equalizer is delayed by a resistor-capacitor (RC) time corresponding to capacitances of the first capacitor and the second capacitor connected in parallel and transmitted to the phase detector.

9. The clock and data recovery device of claim 8, wherein since the first capacitor and the second capacitor are connected in parallel to increase a total capacitance, a resistor-capacitor (RC) delay of the data output from the equalizer is increased compared to a case where both the up signal and the down signal output from the phase detector are at the low levels, so that the phase of the data output from the equalizer and the phase of the clock output from the voltage controlled oscillator are synchronized with each other.

10. The clock and data recovery device of claim 5, wherein
    when the down signal output from the phase detector is at a high level, the first switch is switched from the closed state to the open state, and the second switch is at the open state.

11. The clock and data recovery device of claim 10, wherein
    since the first capacitor is separated from the transmission line, an RC delay of the data output by the equalizer is reduced compared to a case where both the up signal and the down signal output from the phase detector are at the low levels, so that the phase of the data output from the equalizer and the phase of the clock output from the voltage controlled oscillator are synchronized with each other.

* * * * *